United States Patent
Lee et al.

(10) Patent No.: US 11,804,495 B2
(45) Date of Patent: *Oct. 31, 2023

(54) THIN FILM TRANSISTOR ARRAY SUBSTRATE AND MANUFACTURING METHOD THEREOF

(71) Applicant: Samsung Display Co., Ltd., Yongin-si (KR)

(72) Inventors: Young-Wook Lee, Suwon-si (KR); Woo-Geun Lee, Yongin-si (KR); Ki-Won Kim, Suwon-si (KR); Hyun-Jung Lee, Yangju-si (KR); Ji-Soo Oh, Uiwang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/886,489

(22) Filed: Aug. 12, 2022

(65) Prior Publication Data
US 2022/0384491 A1    Dec. 1, 2022

Related U.S. Application Data

(63) Continuation of application No. 17/124,497, filed on Dec. 17, 2020, now Pat. No. 11,437,412, which is a
(Continued)

(30) Foreign Application Priority Data
Jan. 14, 2010 (KR) ......................... 10-2010-0003470

(51) Int. Cl.
*H01L 27/12* (2006.01)
*H01L 29/786* (2006.01)
*H01L 21/768* (2006.01)

(52) U.S. Cl.
CPC ...... *H01L 27/124* (2013.01); *H01L 21/76834* (2013.01); *H01L 27/127* (2013.01);
(Continued)

(58) Field of Classification Search
None
See application file for complete search history.

(56) References Cited

U.S. PATENT DOCUMENTS 8,450,736 B2    5/2013    Lee et al.
9,105,733 B2    8/2015    Lee et al.
(Continued)

FOREIGN PATENT DOCUMENTS

JP    2002-182239    6/2002
JP    2005-227538    8/2005
(Continued)

OTHER PUBLICATIONS

Notice of Allowance dated Jan. 18, 2013 in U.S. Appl. No. 13/006,591.
(Continued)

*Primary Examiner* — Alexander G Ghyka
(74) *Attorney, Agent, or Firm* — H.C. Park & Associates, PLC

(57) ABSTRACT

A substrate including a first signal line and a first electrode disposed on the substrate, an oxide semiconductor layer pattern overlapping the first electrode, an insulating layer disposed between the first electrode and the oxide semiconductor layer pattern, a second signal line intersecting the first signal line, a second electrode electrically connected to the oxide semiconductor layer pattern, a third electrode electrically connected to the oxide semiconductor layer pattern and spaced apart from the second electrode, and an insulator comprising a first portion disposed between the first signal
(Continued)

line and the second signal line, and at least partially overlapping with both of the first signal line and the second signal line.

11 Claims, 12 Drawing Sheets

Related U.S. Application Data continuation of application No. 16/438,385, filed on Jun. 11, 2019, now Pat. No. 10,896,920, which is a continuation of application No. 15/813,758, filed on Nov. 15, 2017, now Pat. No. 10,355,025, which is a continuation of application No. 15/342,756, filed on Nov. 3, 2016, now Pat. No. 9,825,065, which is a continuation of application No. 14/793,183, filed on Jul. 7, 2015, now Pat. No. 9,520,419, which is a continuation of application No. 13/897,879, filed on May 20, 2013, now Pat. No. 9,105,733, which is a continuation of application No. 13/006,591, filed on Jan. 14, 2011, now Pat. No. 8,450,736.

(52) U.S. Cl.
CPC ...... *H01L 27/1218* (2013.01); *H01L 27/1225* (2013.01); *H01L 27/1255* (2013.01); *H01L 27/1262* (2013.01); *H01L 27/1288* (2013.01); *H01L 29/78693* (2013.01); *H01L 29/7869* (2013.01)

(56) References Cited

U.S. PATENT DOCUMENTS

| | | | |
|---|---|---|---|
| 10,335,025 | B2 | 7/2019 | Rifai et al. |
| 10,355,025 | B2 | 7/2019 | Lee et al. |
| 10,896,920 | B2 | 1/2021 | Lee et al. |
| 11,437,412 | B2* | 9/2022 | Lee .................... H01L 27/1288 |
| 2009/0167974 | A1 | 7/2009 | Choi et al. |
| 2013/0140562 | A1 | 6/2013 | Kim et al. |
| 2014/0145178 | A1 | 5/2014 | Lee et al. |

FOREIGN PATENT DOCUMENTS

| | | |
|---|---|---|
| KR | 10-2007-0119235 | 12/2007 |
| KR | 10-2008-0106148 | 12/2008 |

OTHER PUBLICATIONS

Non-Final Office Action dated Nov. 4, 2014 in U.S. Appl. No. 13/897,879.
Notice of Allowance dated Mar. 30, 2015 in U.S. Appl. No. 13/897,879.
Notice of Allowance dated Aug. 3, 2016 in U.S. Appl. No. 14/793,183.
Non-Final Office Action dated Feb. 22, 2017 in U.S. Appl. No. 15/342,756.
Notice of Allowance dated Jul. 20, 2017 in U.S. Appl. No. 15/342,756.
Non-Final Office Action dated Oct. 4, 2018 in U.S. Appl. No. 15/813,758.
Notice of Allowance dated Mar. 13, 2019 in U.S. Appl. No. 15/813,758.
Non-Final Office Action dated Jun. 24, 2020 in U.S. Appl. No. 16/438,385.
Notice of Allowance dated Sep. 16, 2020, in U.S. Appl. No. 16/438,385.
Non-Final Office Action dated Jan. 12, 2022, in U.S. Appl. No. 17/124,497.
Notice of Allowance dated Apr. 25, 2022, in U.S. Appl. No. 17/124,497.

* cited by examiner

THIN FILM TRANSISTOR ARRAY SUBSTRATE AND MANUFACTURING METHOD THEREOF

CROSS-REFERENCE TO RELATED APPLICATIONS

This application is a continuation of U.S. patent application Ser. No. 17/124,497, filed on Dec. 17, 2020, which is a continuation of U.S. patent application Ser. No. 16/438,385, filed on Jun. 11, 2019, now issued as U.S. Pat. No. 10,896,920, which is a continuation of U.S. patent application Ser. No. 15/813,758, filed on Nov. 15, 2017, now issued as U.S. Pat. No. 10,355,025, which is a continuation of U.S. patent application Ser. No. 15/342,756, filed on Nov. 3, 2016, now issued as U.S. Pat. No. 9,825,065, which is a continuation of U.S. patent application Ser. No. 14/793,183, filed on Jul. 7, 2015, now issued as U.S. Pat. No. 9,520,419, which is a continuation of U.S. patent application Ser. No. 13/897,879, filed on May 20, 2013, now issued as U.S. Pat. No. 9,105,733, which is a continuation of U.S. patent application Ser. No. 13/006,591, filed on Jan. 14, 2011, now issued as U.S. Pat. No. 8,450,736, and claims priority from and the benefit of Korean Patent Application No. 10-2010-0003470, filed on Jan. 14, 2010, which are all herein incorporated by reference for all purposes as if fully set forth herein.

BACKGROUND

Field

Exemplary embodiments of the present invention relate to a thin film transistor array substrate and a manufacturing method thereof.

Discussion of the Background

A liquid crystal display ("LCD") device has been adopted as one of the most widely used types of flat panel display ("FPD") devices, typically including two substrates with electrodes, and a liquid crystal layer between the substrates. The substrates may adjust the amount of light passing through the liquid crystal layer by rearranging liquid crystal molecules in the liquid crystal layer using a voltage applied to the electrodes.

In general, an LCD device may include a thin-film transistor ("TFT") for switching each pixel. The TFT may form a three-terminal switching device including a gate electrode to which a switching signal is applied, a source electrode to which a data signal is applied, and a drain electrode to output a data signal. The TFT may include active layers formed between the gate electrode and the source electrode and between the gate electrode and the drain electrode. In this example, amorphous silicon layers may mainly be used as the active layers included in the TFT. Along with the recent trend of larger, high-performance liquid crystal displays, oxide semiconductors have drawn attention as active layers for enhancing the performance of the TFTs.

The use of an oxide semiconductor layer as the active layer can meet high-performance display devices and can reduce capacitance between source/drain electrodes and a gate electrode.

When fabricating TFTs using an oxide semiconductor, however, an oxide semiconductor layer may deteriorate etching rate and/or deposition steps.

Moreover, resistive-capacitive (RC) delay is still becoming a critical problem caused by capacitance between the gate line and the data line and or between the storage line and the data line.

Accordingly, there is a need for an approach to make display devices and methods capable of preventing the capacitance between the gate line and the data line and or between the storage line and the data line while preventing deterioration of the oxide semiconductor layer in the course of manufacture of the TFT array substrate.

SUMMARY

Exemplary embodiments of the present invention provide a TFT array substrate which can prevent capacitance between the gate line and the data line and or between the storage line and the data line while preventing deterioration of the oxide semiconductor layer.

Exemplary embodiments of the present invention provide a method of manufacturing a TFT array substrate which can prevent capacitance between the gate line and the data line and or between the storage line and the data line while preventing deterioration of the oxide semiconductor layer.

Additional features of the invention will be set forth in the description which follows, and in part will be apparent from the description, or may be learned by practice of the invention.

Exemplary embodiments of the present invention disclose a substrate. The substrate includes a gate line and a gate electrode disposed on a substrate, and an oxide semiconductor layer pattern disposed on the gate electrode. The substrate also includes a data line disposed on the oxide semiconductor layer pattern and comprising a source electrode, a drain electrode of a thin film transistor (TFT) and the gate electrode, the data line extending in a direction intersecting the gate line. An etch stop pattern is disposed at an area formed between the source electrode, the drain electrode and the oxide semiconductor layer pattern and at an area formed between the gate line and the data line where the gate line and the data line overlap each other.

Exemplary embodiments of the present invention disclose a method. The method includes forming a gate line and a gate electrode on a substrate. The method also includes forming a gate-insulating layer and an oxide semiconductor layer on the gate line and the gate electrode. The method includes forming etch stop patterns at a TFT area and an area where the gate line and the data line overlap each other. The method also includes forming a data conductor on the oxide semiconductor layer and the etch stop patterns, the data conductor comprising a source electrode and a drain electrode that constitute a TFT together with the gate electrode, and forming a data line extending in a direction intersecting the gate line.

Exemplary embodiments of the present invention disclose a substrate. The substrate includes a plurality of gate lines, gate electrodes, data lines comprising source electrodes and drain electrodes disposed associated with oxide semiconductor layers on a substrate. The substrate also includes etch stop patterns that are disposed at an area respectively formed between the source electrodes/the drain electrodes and the oxide semiconductor layer patterns and at an area respectively formed between the gate lines and the data lines for interconnections at which the gate lines and the data lines overlap one another. The data lines extend in a direction intersecting the gate lines.

Exemplary embodiments of the present invention disclose a substrate. The substrate includes gate wirings including a gate line and a gate electrode disposed on a substrate, an oxide semiconductor layer pattern overlapping the gate electrode, a gate insulating layer disposed between the gate wirings and the oxide semiconductor layer pattern, data wirings including a data line crossing the gate line, a source electrode connected to one side of the oxide semiconductor layer pattern, and a drain electrode connected to another side of the oxide semiconductor layer, and an insulating pattern including a first portion which is disposed between the gate line and the data line and at least partially overlaps with both of the gate line and the data line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION

Figure 1:
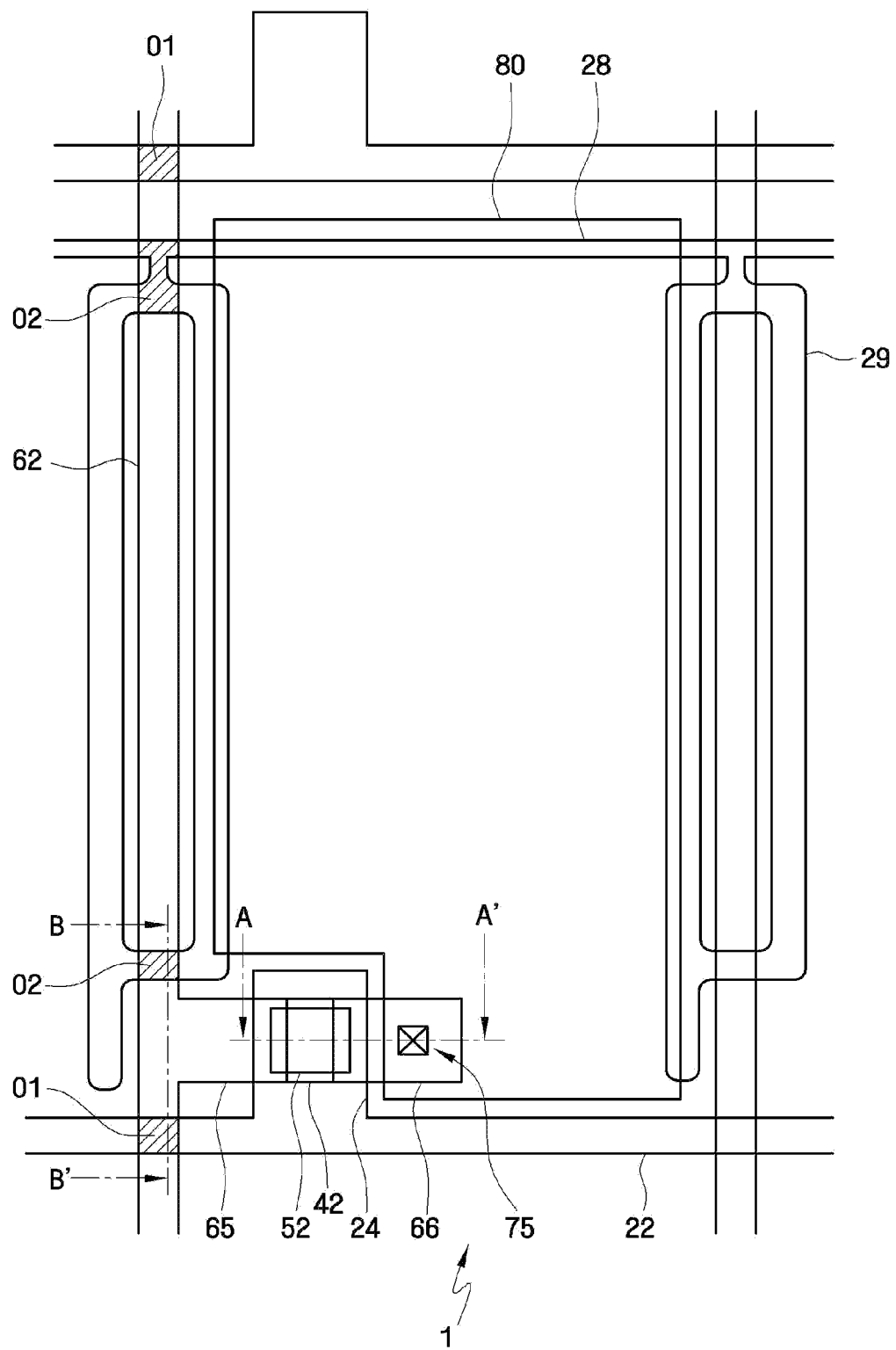
FIG. 1 illustrates a layout view of a TFT array substrate according to exemplary embodiments of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those skilled in the art. In the drawings, the size and relative sizes of layers and regions may be exaggerated for clarity.

It is understood that when an element is referred to as being "on" another element, it can be directly on the other element or intervening elements may be present therebetween. In contrast, when an element is referred to as being "directly on" another element, there may be no intervening elements present. As used herein, the term "and/or" includes any and all combinations of one or more of the associated listed items.

Spatially relative terms, such as "beneath", "below", "lower", "above", "upper", and the like, may be used herein for illustration of elements or spatial relationship with respect to one element or feature's relationship to another element(s) or feature(s) as illustrated in the figures. It will be understood that the spatially relative terms can encompass different orientations of the device in use or operation in addition to the orientation depicted in the figures. Like reference numerals refer to like elements throughout the specification.

Exemplary embodiments of the present invention are described herein with reference to cross section illustrations that are schematic illustrations of exemplary embodiments of the present invention. As such, variations from the shapes of the illustrations as a result, for example, of manufacturing techniques and/or tolerances, are to be expected. Thus, exemplary embodiments of the present invention should not be construed as limited to particular shapes of regions illustrated herein but are to include deviations in shapes that result, for example, from manufacturing process by way of configurations. For example, a region illustrated or described as flat may, typically, have rough and/or nonlinear features. Moreover, sharp angles that are illustrated may be rounded. Thus, the regions illustrated in the figures are schematic in nature and their shapes may not intended to illustrate the precise shape of a region and may not intended to limit the scope of the present invention.

Through the specification, the term "thin film transistor (TFT) array substrate" may be used to mean that a substrate may include at least one TFT, but the term cannot be interpreted to rule out that an intervening element may be present between a TFT and a substrate or another element may be directly thereon.

Hereinafter, a TFT array substrate according to exemplary embodiments of the present invention is described in detail with reference to FIG. 1 and FIG. 2. FIG. 1 illustrates a layout view of a TFT array substrate according to exemplary embodiments of the present invention, and FIG. 2 is a sectional view taken along lines A-A' and B-B' of FIG. 1.

Figure 2:
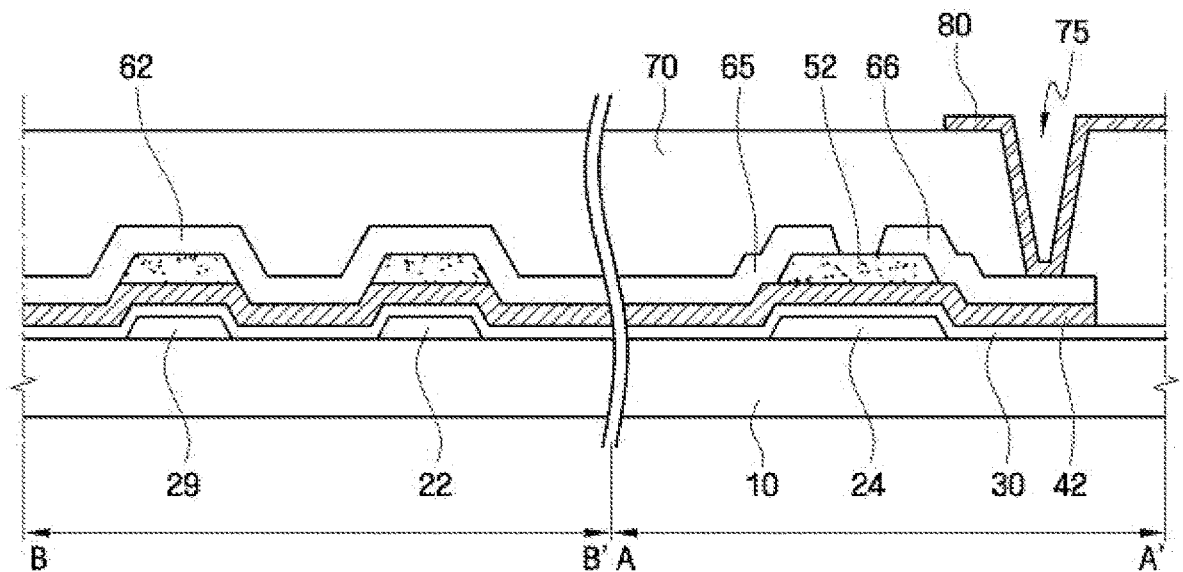
FIG. 2 is a sectional view taken along lines A-A' and B-B' of FIG. 1.

Referring to FIG. 1 and FIG. 2, a gate interconnection (22 and 24, respectively) for transmitting gate signals may be formed on an insulating substrate 10. The gate interconnection (22 and 24) may include a gate line 22 formed in one direction, for example, in a horizontal direction based on the insulating substrate 10, and a gate electrode 24 of a TFT formed as a protrusion on the insulating substrate 10.

A storage line (28 and 29) for transmitting a storage voltage may also be formed on the insulating substrate 10. The storage line (28 and 29) may include a storage electrode line 28 and a storage electrode 29. The storage electrode line 28 may be formed substantially in parallel with the gate line 22 across a pixel area. The storage electrode 29 may be branched from the storage electrode line 28 and may extend in parallel with a data line 62.

For example, the storage electrode 29 may be formed in the form of a rectangular ring formed along the data line 62. In this example, an open area may be formed at a central portion of the storage electrode 29 and the data line 62 may be positioned thereon. At least a portion of the ring of the storage electrode 29 may overlap a pixel electrode 80.

The shape and the arrangement of the storage line (28 and 29) may be varied in alternative embodiments by way of configurations. If the pixel electrode 80 and the gate line 22 generate sufficient storage capacitance by overlapping each other, the storage line (28 and 29) may not be formed.

In some examples, the gate line (22 and 24) and the storage line (28 and 29) may include an aluminum (Al)-based metal such as Al or an Al alloy, a silver (Ag)-based metal such as Ag or an Ag alloy, a copper (Cu)-based metal such as Cu or a Cu alloy, a molybdenum (Mo)-based metal such as Mo or a Mo alloy, chromium (Cr), titanium (Ti) or tantalum (Ta). Each of the gate line (22 and 24) and the storage line (28 and 29) may have a multilayered structure including two conductive layers (not shown) having different physical properties. One of the two conductive layers of each gate line (22 and 24) and storage line (28 and 29) may include a metal with low resistivity, such as an Al-based metal, an Ag-based metal or a Cu-based metal, and may be able to reduce a signal delay or a voltage drop. The other conductive layer of each of the gate line (22 and 24) and the storage line (28 and 29) may include a material having excellent bonding properties to other materials, for example, zinc oxide (ZnO), indium tin oxide (ITO) or indium zinc oxide (IZO), such as a Mo-based metal, Cr, Ti, or Ta. For example, each of the gate line (22 and 24) and the storage line (28 and 29) may include a lower layer formed of Cr and an upper layer formed of Al. Alternatively, each of the gate line (22 and 24) and the storage line (28 and 29) may include a lower layer formed of Al and an upper layer formed of Mo, a lower layer formed of CuMn alloy and an upper layer formed of Cu, a lower layer formed of Ti and an upper layer formed of Cu, and other combinations.

A gate-insulating layer 30 made of a dielectric material such as silicon oxide ($SiO_x$), silicon nitride ($SiN_x$) or silicon oxynitride (SiON) may be formed on the insulating substrate 10, the gate line (22 and 24) and the storage line (28 and 29).

In some examples, the gate-insulating layer 30 may have a single-layered structure or a multi-layered structure. In a case where the gate-insulating layer 30 has a multi-layered structure, it may have a silicon nitride ($SiN_x$) layer and a silicon oxide ($SiO_x$) layer stacked. In this example, the gate-insulating layer 30 may be formed such that a silicon oxide ($SiO_x$) layer is placed in contact with an oxide semiconductor layer pattern 42 and a silicon nitride ($SiN_x$) layer is formed under the silicon oxide ($SiO_x$) layer. In this way, placing the silicon oxide ($SiO_x$) layer to be in contact with the oxide semiconductor layer pattern 42 may prevent the oxide semiconductor layer pattern 42 from deterioration. In a case where the gate-insulating layer 30 has a single-layered structure of a silicon oxynitride (SiON) layer, it may have an oxygen concentration that varies in a thickness direction of the silicon oxynitride (SiON) layer. In this example, the oxygen concentrations may increase as the silicon oxynitride (SiON) layer gets to be closer to the oxide semiconductor layer pattern 42. In such a manner, it is also possible to prevent the oxide semiconductor layer pattern 42 from being deteriorated.

The oxide semiconductor layer pattern 42 for forming a channel of a TFT may be formed on the gate-insulating layer 30. A channel area may be formed by the oxide semiconductor layer pattern 42 overlapping the gate electrode 24. In some examples, the oxide semiconductor layer pattern 42 may have substantially the same shape as a data line (62, 65, and 66) which will be more fully described later, except for the channel area. This is because the oxide semiconductor layer pattern 42 and the data line (62, 65, and 66) may be patterned using a single etch mask in a subsequent process of TFT array substrate fabrication. For example, the oxide semiconductor layer pattern 42 may have substantially the same shape as the data line (62, 65, and 66), except that it is formed in the channel area.

The oxide semiconductor layer pattern 42 may include, for example, a compound represented by the following Formula $A_xB_xO_x$ or $A_xB_xC_xO_x$. For example, A may include Zn or Cd, B may include Ga, Sn or In, and C may include Zn, Cd, Ga, In, or Hf. In addition, X is not 0, and A, B and C are different from one another. In some examples, the oxide semiconductor layer pattern 42 may include at least one selected from the group consisting of InZnO, InGaO, InSnO, ZnSnO, GaSnO, GaZnO, GaZnSnO, GaInZnO, HfInZnO and ZnO. The oxide semiconductor layer pattern 42 can be two to one hundred times larger in the effective charge mobility than hydrogenated amorphous silicon.

Etch stop patterns 52 may be formed on the oxide semiconductor layer pattern 42. For example, the etch stop patterns 52 may be formed at a TFT area where the gate electrode 24 overlaps the source/drain electrodes 65 and 66 which will be more fully described later, an area where the gate line 22 and the data line 62 overlap each other (to be referred to as a first overlapping area, hereinafter, as labeled 'O1' in FIG. 1) and area where the storage line (28 and 29) and the data line 62 overlap each other (to be referred to as a second overlapping area, hereinafter, as labeled 'O2' in FIG. 1).

The etch stop pattern 52 of the TFT area is formed to prevent the oxide semiconductor layer pattern 42 from being damaged by plasma, an etching solution or an etching gas in a etching or deposition process. For example, if the oxide semiconductor layer pattern 42 is damaged by plasma, an etching solution or an etching gas, TFT performance may be greatly lowered. Accordingly, the etch stop pattern 52 of the TFT area is formed so as to cover the oxide semiconductor layer pattern 42, specifically the channel area. It is contemplated that in order to prevent the oxide semiconductor layer pattern 42 from being exposed at the channel area, the etch stop pattern 52 of the TFT area may be formed to be larger at an area where it overlaps the channel area than the channel area in a channel length direction.

On the other hand, the etch stop pattern 52 of the first overlapping area O1 is formed to reduce capacitance between the gate line 22 and the data line 62 in the first overlapping area O1. The etch stop pattern 52 of the second overlapping area O2 is formed to reduce capacitance between the storage line (28 and 29) and the data line 62 in the second overlapping area O2. The capacitance generated between the gate line 22 and the data line 62 or between the storage line (28 and 29) and the data line 62 may cause RC delay. As such, the etch stop patterns 52 are formed on the oxide semiconductor layer patterns 42 of the first overlapping area O1 and the second overlapping area O2.

The etch stop patterns 52 may be made of insulating materials, and examples thereof may include $SiO_x$ or $SiN_x$. In addition, to reduce the capacitance generated between the gate line 22 and the data line 62 or between the storage line (28 and 29) and the data line 62, the etch stop patterns 52 have thicknesses in a range between about 3000 Å and about 3 μm.

The data line (62, 65, and 66) may be formed on the gate-insulating layer 30, the oxide semiconductor layer pattern 42 and the etch stop patterns 52. The data line (62, 65, and 66) may include a data line 62 which extends in a different direction from the gate line 22, for example, in a vertical direction, and may define a pixel by intersecting the gate line 22; a source electrode 65 which branches off from the data line 62 and extends over the oxide semiconductor layer pattern 42 and the etch stop patterns 52; and a drain electrode 66 which is separated from the source electrode 65, may be formed on the oxide semiconductor layer pattern 42 of the TFT area and the etch stop patterns 52, and may face the source electrode 65 in view of the gate electrode 24.

The etch stop patterns 52 may partially be exposed between the source electrode 65 and the drain electrode 66. The oxide semiconductor layer pattern 42 may be disposed under the etch stop patterns 52, the source electrode 65 and the drain electrode 66. For example, the oxide semiconductor layer pattern 42 may completely overlap with the etch stop patterns 52, the source electrode 65 and the drain electrode 66. As described above, the source electrode 65 and the drain electrode 66 may have substantially the same shape with the oxide semiconductor layer pattern 42, except for separated areas overlapping with the channel area.

The data line (62, 65, and 66) may include a single layer or a multiple layer of nickel (Ni), cobalt (Co), titanium (Ti), silver (Ag), copper (Cu), molybdenum (Mo), aluminum (Al), beryllium (Be), niobium (Nb), gold (Au), iron (Fe), selenium (Se), or tantalum (Ta). In addition, alloys containing the above metals and at least one element selected from the group consisting of titanium (Ti), zirconium (Zr), tungsten (W), tantalum (Ta), niobium (Nb), platinum (Pt), hafnium (Hf), oxygen (O), and nitrogen (N) may be applied. For example, the data line (62, 65, and 66) may include a double layer of Ti/Cu, Ta/Al, Ta/Al, Ni/Al, Co/Al, and Mo(Mo alloy)/Cu, or a triple layer of Mo/Al/Mo, Ti/Al/Ti, Ta/Al/Ta, Ti/Al/TiN, Ta/Al/TaN, Ni/Al/Ni, and Co/Al/Co. However, the present invention is not restricted to the listed examples.

A passivation layer 70 may be formed on the data line (62, 65, and 66) and the etch stop patterns 52 exposed by the data line (62, 65, and 66). Like the gate-insulating layer 30, the passivation layer 70 may be made of silicon nitride ($SiN_x$), silicon oxide ($SiO_x$), or silicon oxynitride (SiON). In some examples, the passivation layer 70 may have a double-layered structure including a silicon nitride ($SiN_x$) layer and a silicon oxide ($SiO_x$) layer.

A contact hole 75 exposing a portion of the drain electrode 66 may be formed in the passivation layer 70.

A pixel electrode 80 may be formed on the passivation layer 70. The pixel electrode 80 may be coupled to the drain electrode 66 through the contact hole 75. The pixel electrode 80 may include a transparent conductive material such as ITO or IZO or a reflective conductive material such as aluminum (Al).

The pixel electrode 80 to which a data voltage is applied and a common electrode provided on an upper substrate facing a TFT array substrate can generate an electrical field, thereby determining arrangement of liquid crystal molecules in the liquid crystal layer between the pixel electrode 80 and the common electrode.

Hereinafter, a method of manufacturing the TFT array substrate according to the first embodiment of the present invention, as shown in FIG. 1, will be described in detail with reference to FIG. 1, FIG. 2, FIG. 3, FIG. 4, FIG. 5 and FIG. 6. FIG. 3, FIG. 4, FIG. 5 and FIG. 6 are sectional views illustrating processing steps of a method of manufacturing the TFT array substrate shown in FIG. 1. In the following embodiments, for sake of clarity and ease of explanation, components each having the same function in all the drawings for describing the previous embodiment are respectively identified by the same reference numerals, and their repetitive description will be omitted or briefly given in order to avoid unnecessarily obscuring the invention.

Figure 3:
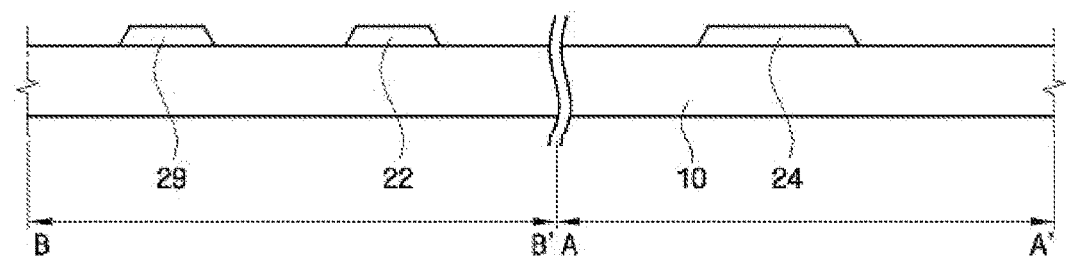
FIG. 3, FIG. 4, FIG. 5, and FIG. 6 are sectional views illustrating processing steps of a method of manufacturing the TFT array substrate shown in FIG. 1.
Figure 4:
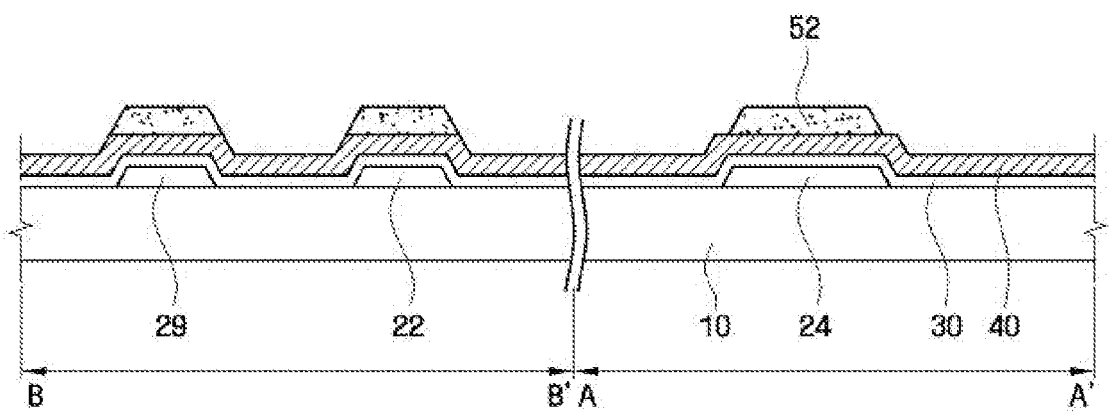
Figure 5:
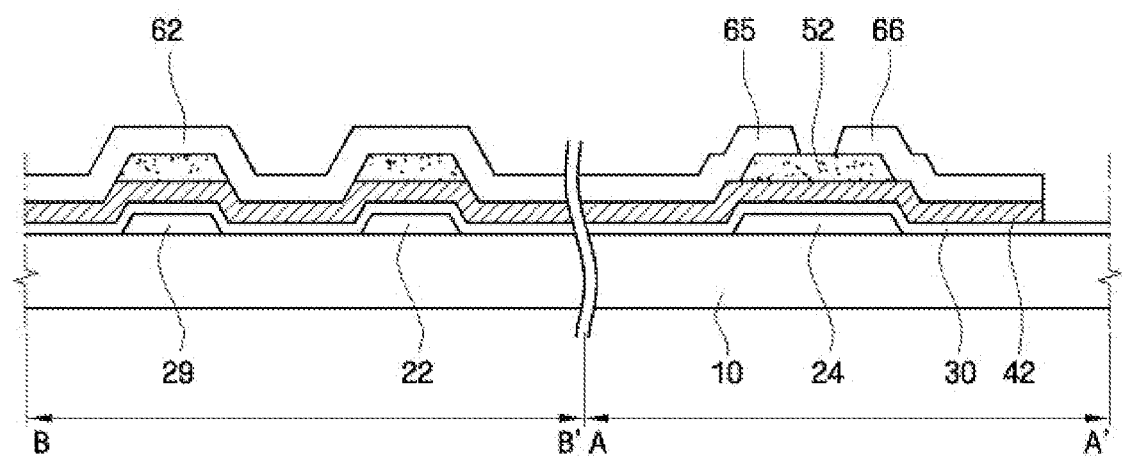
Figure 6:
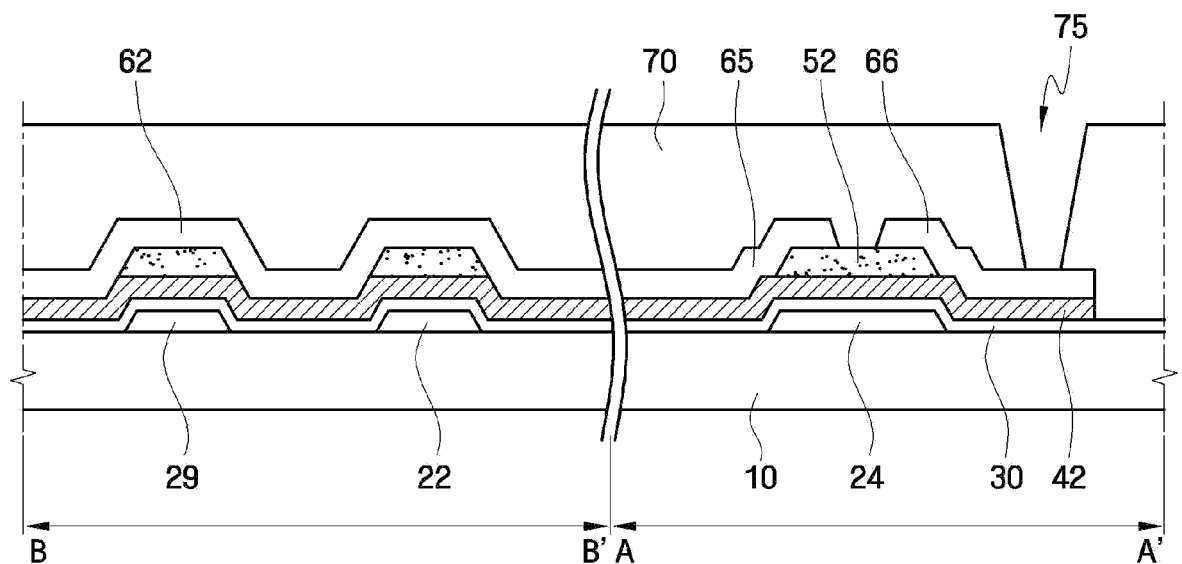

Referring first to FIG. 1, FIG. 2 and FIG. 3, the gate line (22 and 24) and the storage line (28 and 29) may be formed on the insulating substrate 10.

For example, a conductive layer for forming a gate line may be formed on the insulating substrate 10 by a sputtering method and the conductive layer is patterned, thereby forming the gate line (22 and 24) and the storage line (28 and 29).

Next, referring to FIG. 1, FIG. 2, FIG. 3 and FIG. 4, the gate-insulating layer 30, the oxide semiconductor layer 40 and the etch stop patterns 52 may be formed on the resultant structure having the gate line (22 and 24) and the storage line (28 and 29).

For example, the gate-insulating layer 30 may be formed by chemical vapor deposition (CVD) or sputtering, and the oxide semiconductor layer 40 may be formed on the gate-insulating layer 30 by sputtering.

For example, CVD is performed on the oxide semiconductor layer 40 to form an etch stop layer and the etch stop layer is patterned, thereby forming the etch stop patterns 52. As described above, the etch stop patterns 52 may be formed to cover the channel area of TFT, the first overlapping area O1 and the second overlapping area O2.

Next, referring to FIG. 1, FIG. 2, FIG. 3, FIG. 4 and FIG. 5, the oxide semiconductor layer 40 may be patterned while forming the data line (62, 65, and 66) on the resultant structure having the etch stop patterns 52, thereby forming the oxide semiconductor layer pattern 42.

For example, a conductive layer for forming a data line may be formed on the oxide semiconductor layer 40 and the etch stop patterns 52 by, for example, a sputtering method and the conductive layer and the oxide semiconductor layer 40 may simultaneously be patterned, thereby forming the oxide semiconductor layer pattern 42 and the data line (62, 65, and 66).

The source electrode 65 and the drain electrode 66 may be spaced apart from and face each other in view of the gate electrode 24. The etch stop patterns 52 may be exposed at the spaced-apart area of the source electrode 65 and the drain electrode 66. In this way, in the course of etching for forming the data line (62, 65, and 66) and the oxide semiconductor layer pattern 42, the gate-insulating layer 30 and the etch stop patterns 52 may not be damaged. Accordingly, the oxide semiconductor layer pattern 42 disposed under the etch stop patterns 52 can be protected.

It is noted that since the etch stop patterns 52 are interposed between the gate line 22 and the data line 62 in the first overlapping area O1 and between the storage line (28 and 29) and the data line 62 in the second overlapping area O2, capacitance between the gate line 22 and the data line 62 and capacitance between the storage line (28 and 29) and the data line 62 can be reduced.

Next, referring to FIG. 1, FIG. 2, FIG. 3, FIG. 4, FIG. 5 and FIG. 6, the passivation layer 70 may be formed on the resultant structure by PECVD or reactive sputtering and patterned by photolithography, thereby forming the contact hole 75 exposing a portion of the drain electrode 66.

Turning to FIG. 1 and FIG. 2, a conductive layer for forming a pixel electrode 80 connected to the portion of the drain electrode 66 may be formed on the passivation layer 70 and the conductive layer is patterned, thereby forming the pixel electrode 80.

Figure 7:
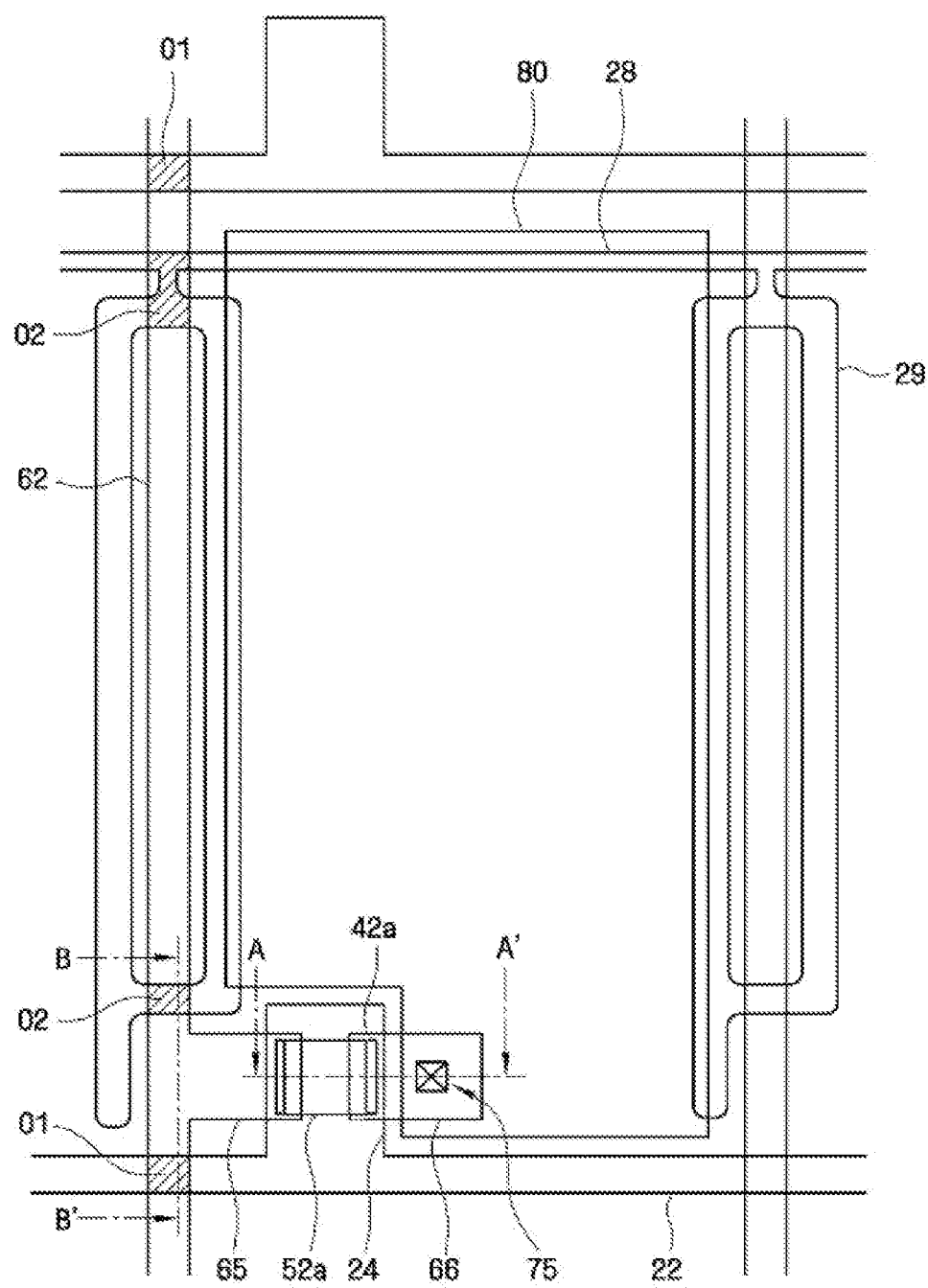
FIG. 7 illustrates a layout view of a TFT array substrate according to exemplary embodiments of the present invention.
Figure 8:
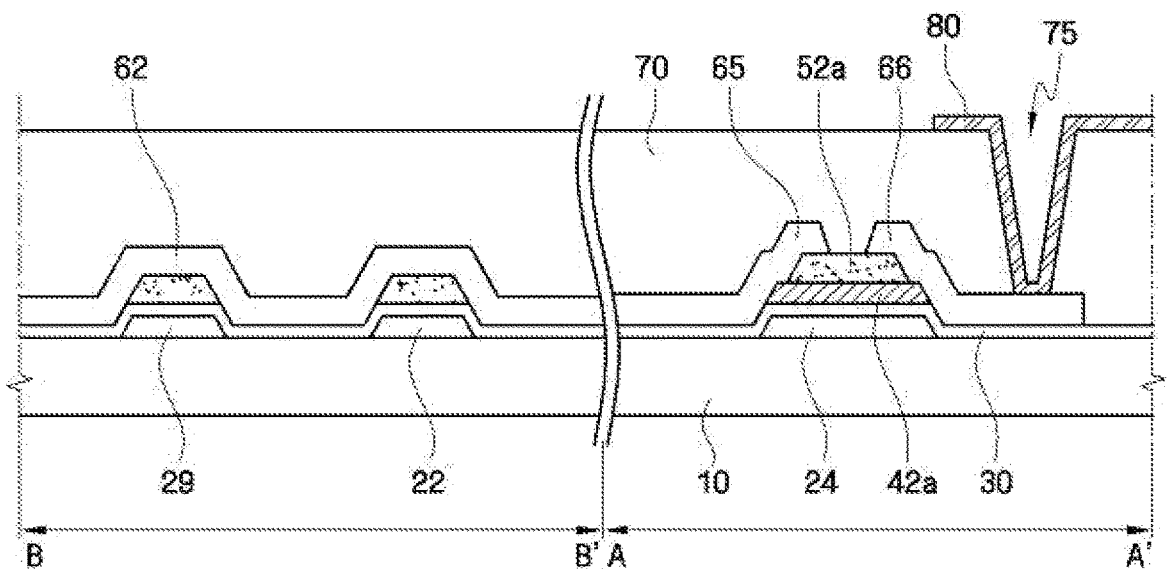
FIG. 8 is a sectional view taken along lines A-A' and B-B' of FIG. 7.

Hereinafter, a TFT array substrate is described in detail with reference to FIG. 7 and FIG. 8. FIG. 7 illustrates a layout view of a TFT array substrate, and FIG. 8 is a sectional view taken along lines A-A' and B-B' of FIG. 7. In some examples, an oxide semiconductor layer pattern 42a of a TFT array substrate may not be formed to have substantially the same shape as the data line (62, 65, and 66) because the oxide semiconductor layer pattern 42a and the data line (62, 65, and 66) are etched using different masks in the course of manufacturing the TFT array substrate according to exemplary embodiments, which will be more fully described later.

For example, the oxide semiconductor layer pattern 42a may be formed in an island shape so as to overlap the gate electrode 24 in the TFT area. Accordingly, the oxide semiconductor layer pattern 42a may be formed only at the TFT area.

An etch stop pattern 52a of the TFT area may be formed on the oxide semiconductor layer pattern 42a to cover the channel area. It is contemplated that in order to prevent the oxide semiconductor layer pattern 42a from being exposed at the channel area, the etch stop pattern 52a of the TFT area may be formed to be larger at an area where it overlaps the channel area than the channel area in a channel length direction. In some examples, in order to obtain wider contact areas between the oxide semiconductor layer pattern 42a and the source/drain electrodes 65 and 66, it is contemplated that the etch stop pattern 52a of the TFT area may be formed to be narrower than the oxide semiconductor layer pattern 42a in the channel length direction.

On the other hand, as described previously, the etch stop patterns 52a of the first and second overlapping areas O1 and O2 may be formed on the gate-insulating layer 30 in the first and second overlapping areas O1 and O2, respectively, because the oxide semiconductor layer pattern 42a is formed only at the TFT area.

For example, materials for forming the oxide semiconductor layer pattern 42a and the etch stop patterns 52a may substantially be the same as those of the first embodiment. In this example, the etch stop patterns 52a may have thicknesses in a range between about 3000 Å and about 3 μm.

Figure 9:
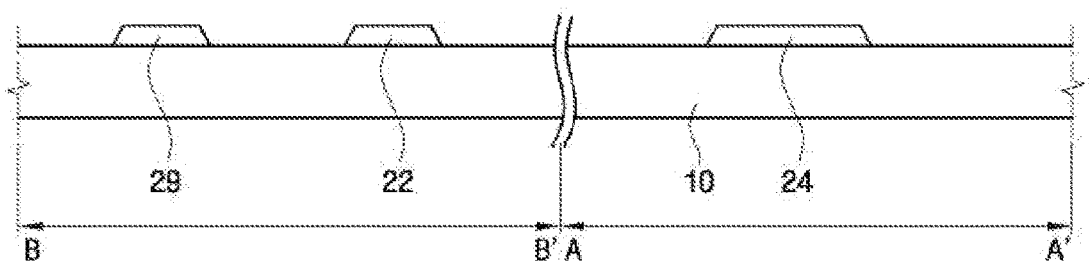
FIG. 9, FIG. 10, FIG. 11 are sectional views illustrating processing steps of a method of manufacturing the TFT array substrate shown in FIG. 7.
Figure 10:
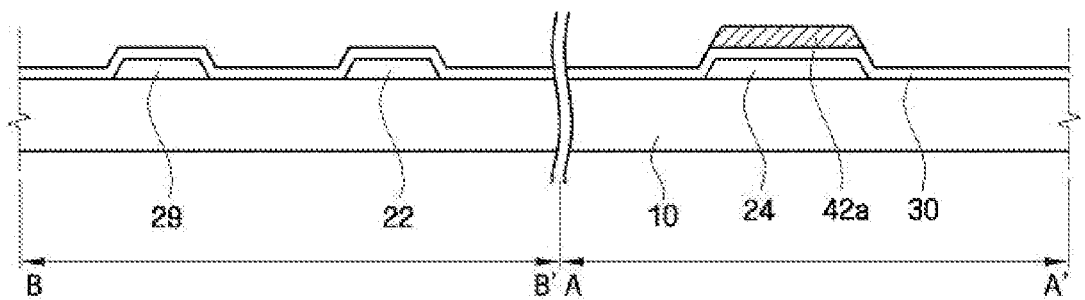
Figure 11:
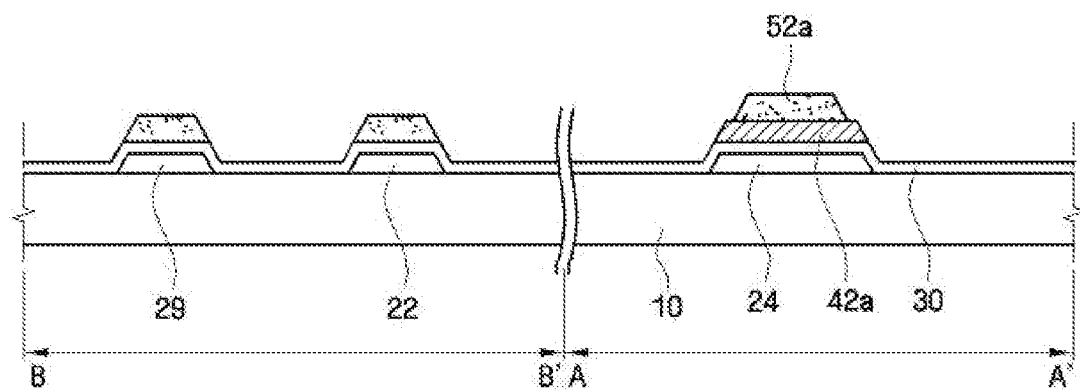

Hereinafter, a method of manufacturing the TFT array substrate according to exemplary embodiments of the present invention is described in detail with reference to FIG. 7, FIG. 8, FIG. 9, FIG. 10 and FIG. 11. FIG. 9, FIG. 10 and FIG. 11 are sectional views illustrating processing steps of a method of manufacturing the TFT array substrate shown in FIG. 7.

Referring to FIG. 7 and FIG. 9, the gate line (22 and 24) and the storage line (28 and 29) may be formed on the insulating substrate 10.

Next, referring to FIG. 7 and FIG. 10, the gate-insulating layer 30 and the oxide semiconductor layer pattern 42a may be formed on the resultant structure having the gate line (22 and 24) and the storage line (28 and 29).

For example, the gate-insulating layer 30 is formed, sputtering is performed to form an oxide semiconductor layer on the gate-insulating layer 30 and the oxide semiconductor layer is patterned, thereby forming the oxide semiconductor layer pattern 42a. As described above, the oxide semiconductor layer pattern 42a may be formed on the gate electrode 24 in an island shape.

Referring to FIG. 7 and FIG. 11, an etch stop layer may be formed on the oxide semiconductor layer pattern 42a and the gate-insulating layer 30, and the etch stop layer is patterned, thereby forming the etch stop patterns 52a. In this example, the etch stop patterns 52a may be formed on the oxide semiconductor layer pattern 42a of the TFT area and on the gate-insulating layer 30 in the first and second overlapping areas O1 and O2, respectively. For example, a channel-length directional width of the etch stop pattern 52a of the TFT area may be smaller than that of the oxide semiconductor layer pattern 42a.

Referring to FIG. 7 and FIG. 8, the data line (62, 65, and 66) and the passivation layer 70 may be formed on the resultant structure and the passivation layer 70 is patterned by photolithography, thereby forming the contact hole 75. Thereafter, the pixel electrode 80 connected to a portion of the drain electrode 66 through the contact hole 75 may be formed on the passivation layer 70.

Figure 12:
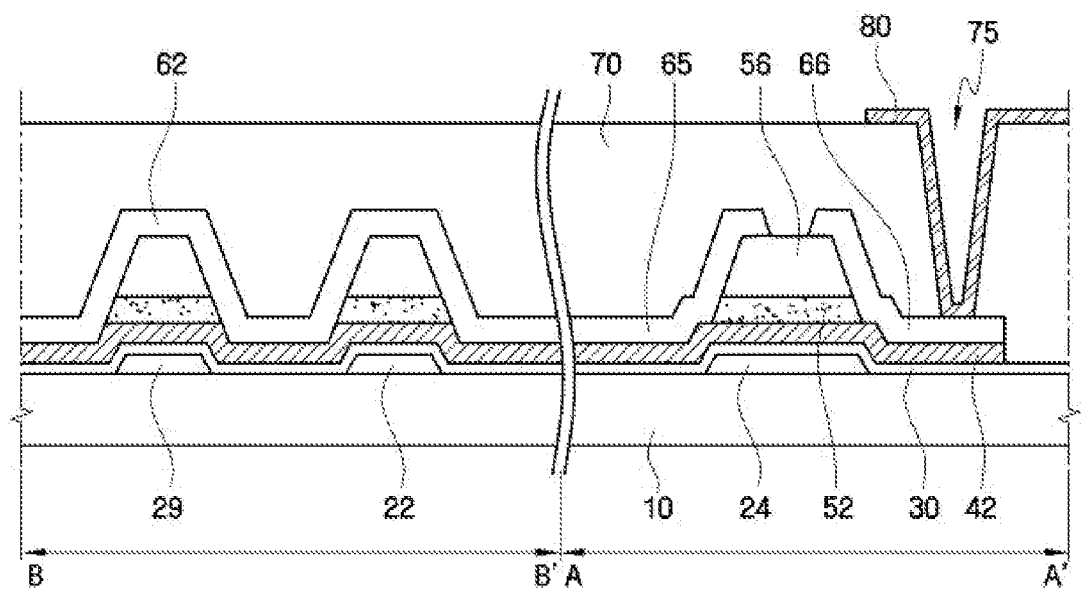
FIG. 12 is a sectional view of a TFT array substrate according to exemplary embodiments of the present invention.

Hereinafter, a TFT array substrate is described in detail with reference to FIG. 1 and FIG. 12. FIG. 12 is a sectional view of a TFT array substrate according to exemplary embodiments of the present invention.

In some examples, the TFT array substrate may further include a low-k dielectric material pattern 56 on the etch stop patterns 52, compared to the TFT array substrate according to exemplary embodiments. The low-k dielectric material pattern 56 may have substantially the same configuration (i.e., shape) as the etch stop patterns 52. This is because the etch stop patterns 52 and the low-k dielectric material pattern 56 are to be patterned using a single etch mask in a subsequent process of TFT array substrate fabrication. The present invention is not limited to the illustrated embodiment, but the low-k dielectric material pattern 56 may be patterned independent of the etch stop patterns 52.

For example, the low-k dielectric material pattern 56 may be formed of a material having a lower dielectric constant than a silicon nitride layer, for example, a relative dielectric constant of smaller than 4. The low-k dielectric material may include at least one material selected from the group consisting of SiBN, SiCN, BCN, BN and CN.

The low-k dielectric material pattern 56 may further be provided on the etch stop patterns 52 for the purpose of reducing a processing time in the process of TFT array substrate fabrication while further reducing capacitance between the gate line 22 and the data line 62 in the first overlapping area O1 and capacitance between the storage line (28 and 29) and the data line 62 in the second overlapping area O2.

It is observed that the greater the sum of thicknesses of the etch stop layer 50 and the low-k dielectric material layer 54, the more the capacitance between the gate line 22 and the data line 62 in the first overlapping area O1 and the capacitance between the storage line (28 and 29) and the data line 62 in the second overlapping area O2 are reduced. For example, the sum of thicknesses of the etch stop layer 50 and the low-k dielectric material layer 54 may be in a range between about 3000 Å and about 3 μm.

In some examples, a thickness of the low-k dielectric material pattern 56 may greater than that of the etch stop patterns 52. In this example, the processing time can be reduced in the process of TFT array substrate fabrication.

While exemplary embodiments show that the low-k dielectric material pattern 56 is stacked on the etch stop patterns 52, the invention is not limited thereto and the stacking order may be reversed. For example, the etch stop patterns 52 may be stacked on the low-k dielectric material pattern 56.

Figure 13:
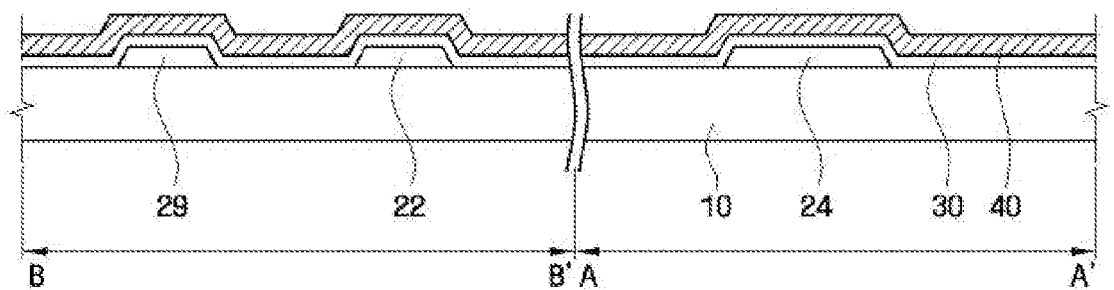
FIG. 13, FIG. 14 and FIG. 15 are sectional views illustrating processing steps of a method of manufacturing the TFT array substrate of FIG. 12.
Figure 14:
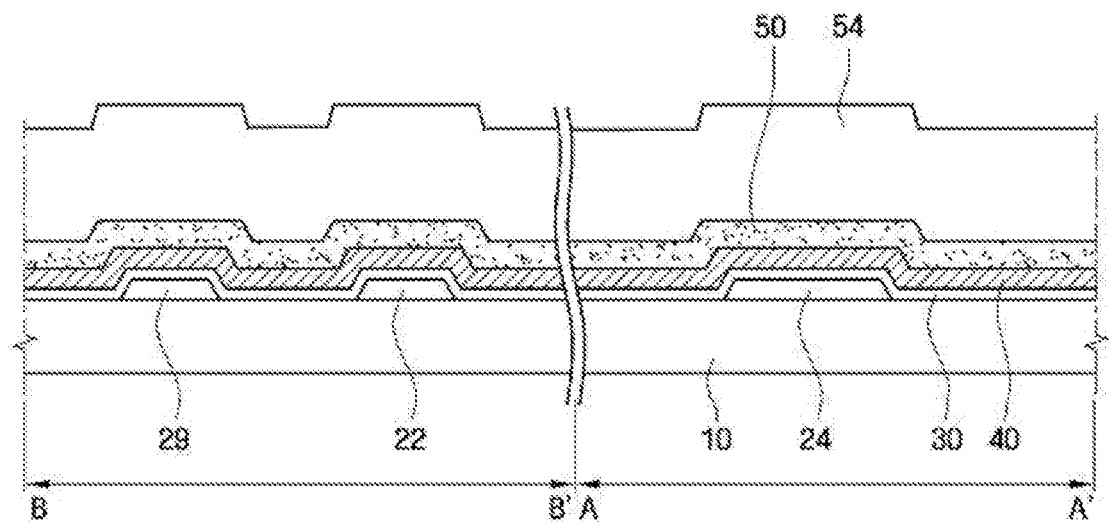
Figure 15:
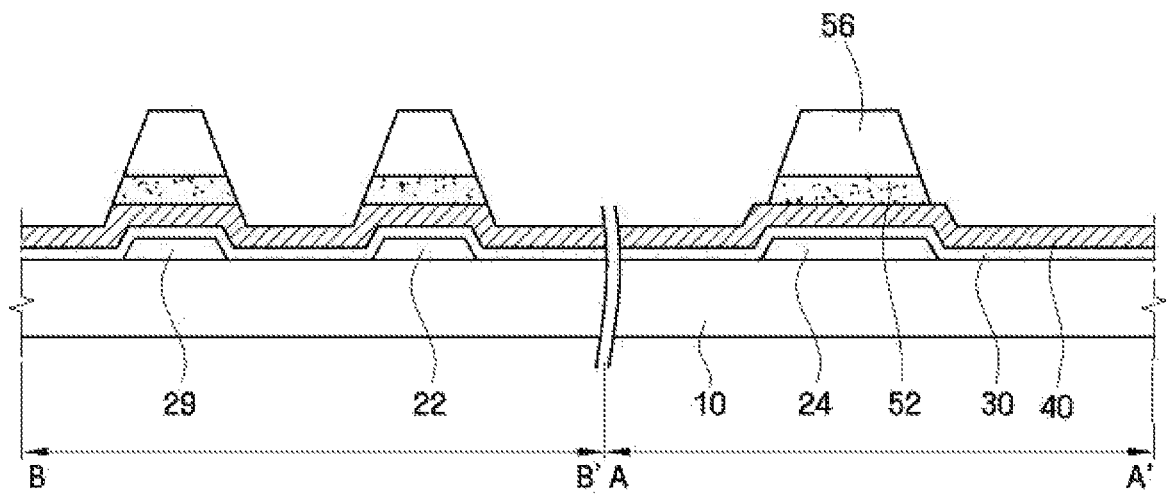

Hereinafter, a method of manufacturing the TFT array substrate according to exemplary embodiments of the present invention, as shown in FIG. 12, is described in detail with reference to FIG. 1 and FIG. 12, FIG. 13, FIG. 14 and FIG. 15. FIG. 13, FIG. 14 and FIG. 15 are sectional views illustrating processing steps of a method of manufacturing the TFT array substrate shown in FIG. 12.

Referring first to FIG. 13, the gate line (22 and 24) and the storage line (28 and 29) may be formed on the insulating substrate 10.

The gate-insulating layer 30 and the oxide semiconductor layer 40 may be formed on the resultant structure having the gate line (22 and 24) and the storage line (28 and 29).

Referring to FIG. 14, the etch stop layer 50 and the low-k dielectric material layer 54 may be formed on the oxide semiconductor layer 40 and the gate-insulating layer 30.

For example, the etch stop layer 50 including at least one material selected from $SiO_x$ or $SiN_x$ may first be formed by, for example, CVD, and the low-k dielectric material layer 54 is formed of a material having a lower dielectric constant than a silicon nitride layer, for example, a relative dielectric constant of smaller than 4. The low-k dielectric material layer 54 may include at least one material selected from the group consisting of SiBN, SiCN, BCN, BN and CN.

As described above, the greater the sum of thicknesses of the etch stop layer 50 and the low-k dielectric material layer 54, the more the capacitance between the gate line 22 and the data line 62 in the first overlapping area O1 and the capacitance between the storage line (28 and 29) and the data line 62 in the second overlapping area O2 can be reduced. For example, the sum of thicknesses of the etch stop layer 50 and the low-k dielectric material layer 54 may be in a range between about 3000 Å and about 3 μm.

Moreover, since the low-k dielectric material layer 54 is formed more rapidly than the etch stop layer 50, a processing time can be advantageously reduced by forming the relatively thin etch stop layer 50 and the relatively thick low-k dielectric material layer 54 while the sum of thicknesses of the etch stop layer 50 and the low-k dielectric material layer 54 is maintained at a constant level.

While exemplary embodiment show that the etch stop layer 50 and the low-k dielectric material layer 54 are sequentially formed, the invention is not limited thereto and the formation order may be reversed. Namely, the low-k dielectric material layer 54 may first be formed and the etch stop layer 50 may then be formed. For example, the etch stop layer 50 may be stacked on the low-k dielectric material layer 54.

Referring to FIG. 15, the low-k dielectric material layer 54 and the etch stop layer 50 may simultaneously be patterned, thereby forming etch stop patterns 52 and a low-k dielectric material pattern 56 disposed on the etch stop patterns 52.

Turning to FIG. 12, an oxide semiconductor layer pattern 42 and a data line (62, 65, and 66) may be formed on the resultant structure.

For example, a conductive layer for forming a data line may be formed on the resultant structure having the oxide semiconductor layer 40, the etch stop patterns 52 and the low-k dielectric material pattern 56 stacked, and the conductive layer and the oxide semiconductor layer 40 may simultaneously be patterned by photolithography, thereby forming the oxide semiconductor layer pattern 42 and the data line (62, 65, and 66).

Next, a passivation layer 70 may be formed on the resultant structure and patterned by photolithography, thereby forming a contact hole 75. For example, a pixel electrode 80 connected to a portion of a drain electrode 66 through the contact hole 75 may be formed on the passivation layer 70.

Meanwhile, although not illustrated in the specification, in alternative embodiments of the present invention, for example, a low-k material pattern may be formed on the etch stop patterns 52a of the second embodiment instead of the etch stop patterns 52 of the first embodiment. It is noted that the TFT array substrates and methods of manufacturing the same can easily be performed by a person of ordinary skill in the art, and their detailed description may be omitted in order to avoid unnecessarily obscuring the invention.

Figure 16:
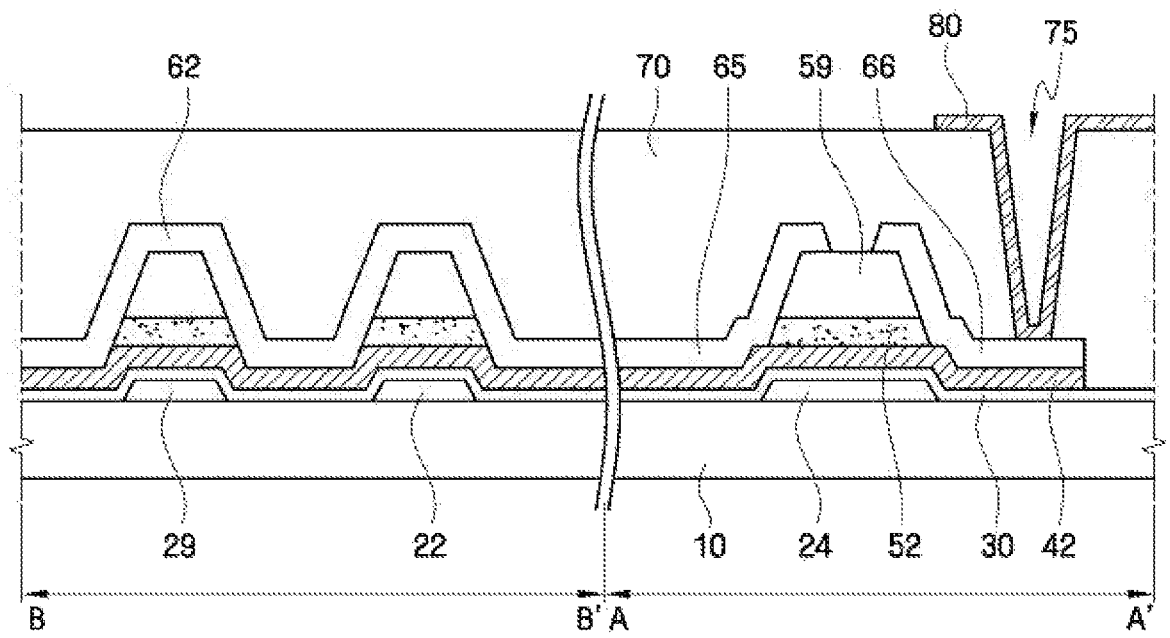
FIG. 16 is a sectional view of a TFT array substrate according to exemplary embodiments of the present invention.

Hereinafter, a TFT array substrate is described in detail with reference to FIG. 1 and FIG. 16. FIG. 16 is a sectional view of a TFT array substrate according to exemplary embodiments of the present invention.

The TFT array substrate may further include a transparent organic layer pattern 59 on etch stop patterns 52. The transparent organic layer pattern 59 may have substantially the same configuration (i.e., shape) as the etch stop patterns 52. This is because the transparent organic layer pattern 59 is to be used as an etch mask in an etching process for forming the etch stop patterns 52. For example, a data line (62, 65, and 66) may be formed in a process in a state in which the transparent organic layer pattern 59 used as the etch mask in forming the etch stop patterns 52 is left over without being removed.

The transparent organic layer pattern 59 may be made of, for example, polyimide.

The transparent organic layer pattern 59 may be left over on the etch stop patterns 52 for the purpose of simplifying processing steps of the method of manufacturing the TFT array substrate while for reducing capacitance between the gate line 22 and the data line 62 in the first overlapping area O1 and capacitance between the storage line (28 and 29) and the data line 62 in the second overlapping area O2.

Figure 17:
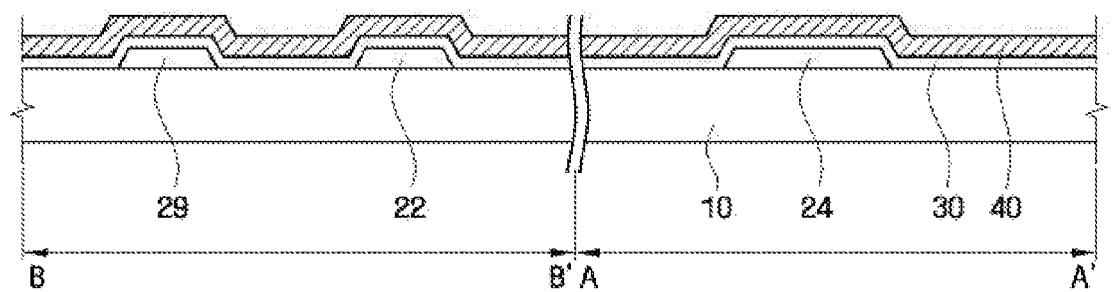
FIG. 17, FIG. 18 and FIG. 19 are sectional views illustrating processing steps of a method of manufacturing the TFT array substrate of FIG. 16.
Figure 18:
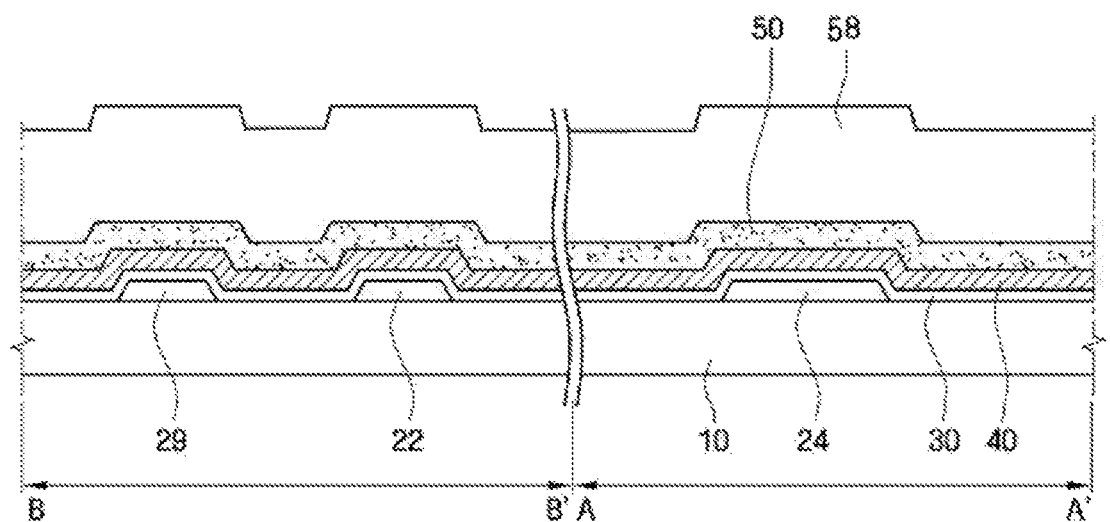
Figure 19:
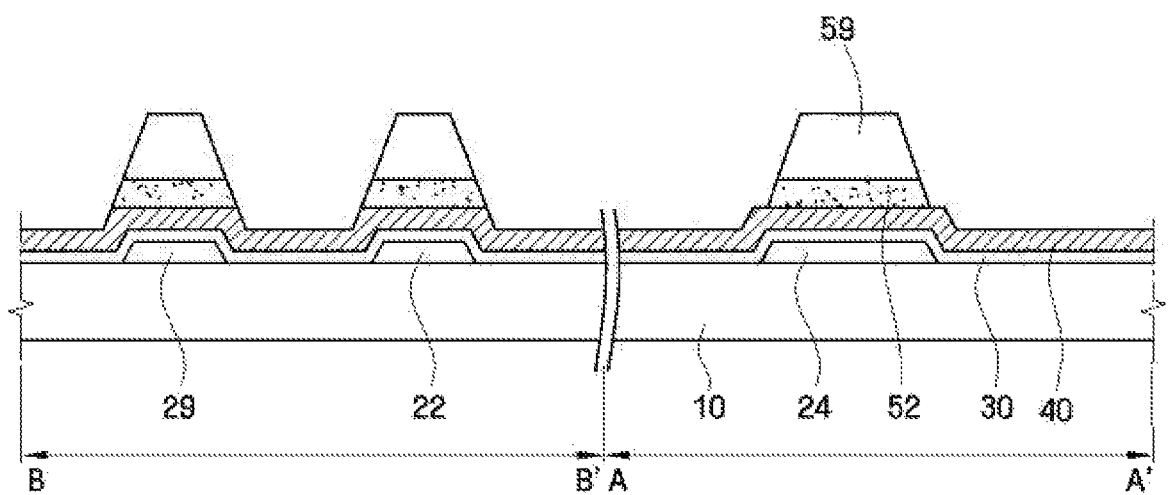

Hereinafter, a method of manufacturing the TFT array substrate, as shown in FIG. 16, is described in detail with reference to FIG. 1 and FIG. 16, FIG. 17, FIG. 18 and FIG. 19. FIG. 17, FIG. 18 and FIG. 19 are sectional views illustrating processing steps of a method of manufacturing the TFT array substrate shown in FIG. 16.

Referring first to FIG. 17, the gate line (22 and 24) and the storage line (28 and 29) may be formed on the insulating substrate 10.

Next, the gate-insulating layer 30 and the oxide semiconductor layer 40 may be formed on the resultant structure having the gate line (22 and 24) and the storage line (28 and 29).

Referring to FIG. 18, the etch stop layer 50 and the transparent organic layer 58 may be formed on the oxide semiconductor layer 40 and the gate-insulating layer 30.

For example, the etch stop layer 50 including at least one material selected from the group consisting of $SiO_x$ and $SiN_x$ may be formed by, for example, CVD, and the transparent organic layer 58 may be formed by, for example, spin coating, slit coating, spin & slit coating, slot dyeing, or gravure printing, on the etch stop layer 50

Next, referring to FIG. 19, the transparent organic layer 58 may be exposed to light, followed by developing, thereby forming a transparent organic layer pattern 59. The etch stop layer 50 may be patterned using the transparent organic layer pattern 59 as an etch mask, thereby forming the etch stop patterns 52.

Referring to FIG. 16, in a state in which the transparent organic layer pattern 59 is not removed, the oxide semiconductor layer pattern 42 and the data line (62, 65, and 66) may be formed on the gate-insulating layer 30.

For example, a conductive layer for forming a data line may be formed on the resultant structure having the oxide semiconductor layer 40, the etch stop patterns 52 and the transparent organic layer pattern 59 stacked, and the conductive layer and the oxide semiconductor layer 40 may simultaneously be patterned by photolithography, thereby forming the oxide semiconductor layer pattern 42 and the data line (62, 65, and 66).

Next, a passivation layer 70 may be formed on the resultant structure and patterned by photolithography, thereby forming a contact hole 75. A pixel electrode 80 connected to a portion of a drain electrode 66 through the contact hole 75 may be formed on the passivation layer 70.

Meanwhile, although not illustrated in the specification, in alternative embodiments of the present invention, a transparent organic layer pattern may be formed on the etch stop patterns 52a of the second embodiment instead of the etch stop patterns 52 of the fourth embodiment. It is noted that the TFT array substrates and methods of manufacturing the same can easily be performed by a person of ordinary skill in the art, and their detailed description may be omitted in order to avoid unnecessarily obscuring the invention.

As described above, in the TFT array substrates according to exemplary embodiments of the present invention and the methods of manufacturing the same, oxide semiconductor layers can be prevented from being deteriorated during the processing steps, and capacitance between lines can be reduced.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A substrate, comprising:
    a first signal line and a first electrode disposed on the substrate;
    an oxide semiconductor layer pattern overlapping the first electrode;
    an insulating layer disposed between the first electrode and the oxide semiconductor layer pattern;
    a second signal line intersecting the first signal line;
    a second electrode electrically connected to the oxide semiconductor layer pattern;
    a third electrode electrically connected to the oxide semiconductor layer pattern and spaced apart from the second electrode; and
    an insulator comprising a first portion disposed between the first signal line and the second signal line, and at least partially overlapping with both of the first signal line and the second signal line.

2. The substrate of claim 1, wherein the insulator further comprises a second portion disposed between the second electrode, the third electrode, and the oxide semiconductor layer pattern, and at least partially overlapping with the first electrode.

3. The substrate of claim 1, further comprising a third signal line disposed on the same layer as the first signal line and the first electrode,
    wherein the insulator further comprises a third portion disposed between the third signal line and the second signal line, and at least partially overlapping with both the second signal line and the third signal line.

4. The substrate of claim 1, wherein the insulator comprises at least one of silicon oxide and silicon nitride.

5. The substrate of claim 1, further comprising a low-k dielectric material pattern disposed on or under the insulator to form a stacked structure together with the insulator.

6. The substrate of claim 5, wherein the low-k dielectric material pattern comprises at least one material selected from the group consisting of SiBN, SiCN, BCN, BN, and CN.

7. The substrate of claim 5, wherein a thickness of the low-k dielectric material pattern is greater than a thickness of the insulator.

8. The substrate of claim 1, further comprising a transparent organic layer pattern disposed on the insulator to form a stacked structure together with the insulator.

9. The substrate of claim 8, wherein the transparent organic layer pattern is configured to function as an etch mask for patterning the insulator.

10. The substrate of claim 1, wherein the insulator is disposed on the insulating layer.

11. The substrate of claim 1, wherein the second electrode and the third electrode directly contact the oxide semiconductor layer pattern.

* * * * *